United States Patent [19]

Weixelman et al.

[11] Patent Number: 4,929,899
[45] Date of Patent: May 29, 1990

[54] FLUXGATE MAGNETOMETER APPARATUS AND ADJUSTMENT METHOD TO MAINTAIN ACCURACY OVER A WIDE TEMPERATURE RANGE

[75] Inventors: Lawrence M. Weixelman; Richard D. Swanson, both of Wichita, Kans.

[73] Assignee: Boeing Company

[21] Appl. No.: 159,751

[22] Filed: Feb. 24, 1988

[51] Int. Cl.⁵ ..................... G01R 33/04; G01C 17/28
[52] U.S. Cl. .................................. 324/253; 324/224; 33/361
[58] Field of Search ............... 324/253, 254, 255, 224; 33/361

[56] References Cited

U.S. PATENT DOCUMENTS

| | | |
|---|---|---|
| 2,150,386 | 3/1939 | Manley . |
| 2,343,159 | 2/1944 | Sias . |
| 2,848,656 | 8/1958 | Nixon . |
| 3,264,528 | 8/1966 | Leifer . |
| 3,281,670 | 10/1966 | Myers et al. . |
| 3,434,047 | 3/1969 | Brickner . |
| 3,449,665 | 6/1969 | Geyger . |
| 3,626,280 | 12/1981 | Van Englehouen ................. 324/253 |
| 3,808,508 | 4/1974 | Ford . |
| 3,943,763 | 3/1976 | Garner . |
| 4,528,481 | 7/1985 | Becker et al. . |

OTHER PUBLICATIONS

D. Garner, "A Magnetic Heading Reference for the Electrofluidic Autopilot (Part 1)," Sport Aviation 19 (Nov. 22, 1981).
D. Garner, "A Magnetic Heading Reference for the Electrofluidic Autopilot (Part 2)," Sport Aviation 28 (Dec. 30, 1981).

Primary Examiner—Reinhard J. Eisenzopf
Assistant Examiner—Walter E. Snow

[57] ABSTRACT

A fluxgate magnetometer having wide temperature range accuracy, without adding temperature compensating components, is obtained by: (1) a fluxgate adjusted by aligning a permeable magnetic tape core relative to the secondary winding of the fluxgate so as to substantially equalize each of the pulses induced in the secondary winding by the transition from core saturation to unsaturation in both directions, and (2) increasing the fluxgate magnetometer primary drive current above what is normally considered saturation current to reduce sensitivity of the output to temperature and primary drive changes.

15 Claims, 6 Drawing Sheets

MAGNETOMETER OUTPUT SIGNAL

FLUXGATE MAGNETOMETER APPARATUS AND ADJUSTMENT METHOD TO MAINTAIN ACCURACY OVER A WIDE TEMPERATURE RANGE

BACKGROUND OF THE INVENTION

The present invention relates to magnetometers and, more particularly, to an improved fluxgate magnetometer and method of adjusting fluxgates for temperature compensation.

DESCRIPTION OF RELATED ART

Two basic systems exist for detecting the direction of the earth's magnetic field. In the first, a needle or similar shape of magnetic material is magnetized to create a north seeking pole at one end and a south seeking pole at the other. If the needle is allowed to float in a liquid it will align itself with the earth's magnetic field. Such detectors, however, are not practical for vehicles which manuever into various attitudes or which operate within a reasonably severe vibrational environment.

In the second type of system, a unit commonly referred to as a fluxgate is used. The fluxgate consists of a highly permeable magnetic core, usually in the shape of a toroid, having two sets of electrical windings. One such set, known as the primary or drive winding, is wound around the toroid. An alternating electrical signal is applied to this winding. As the electrical signal alternates it drives the magnetic core in and out of magnetic saturation.

The earth's magnetic field rushes into the core when it is unsaturated and a major portion is forced out when the core is saturated. By placing another winding, commonly called the secondary winding or sense coil, over the toroid the inrush and outrush of the earth s magnetic field can be detected because a voltage pulse is generated in this winding each time the earth's field changes in the toroid. The secondary winding is wound so that the effect of the primary drive alternating signal is cancelled out.

The magnitudes of the secondary coil output pulses depend upon the strength of the earth s magnetic field and the alignment of the toroid and secondary coil in the earth's magnetic field. By maintaining the secondary coil level with respect to the earth's surface the magnitude of the pulses can be calibrated to indicate the deviation of the secondary coil axis from magnetic north. This provides heading or directional information.

One problem with this construction is that the magnitudes of the output pulses are also affected by the temperature of the toroid, affecting the accuracy of any reading. There are two factors which are responsible for this problem: (1) a discontinuity in the toroid magnetic path that is affected by temperature, and (2) changes in the magnetic properties of the toroid magnetic material with changes in temperature.

The discontinuity in the magnetic path results from the physical construction of the toroid. For high frequency or pulse applications the toroids are typically assembled by winding tape of the highly permeable mu material such as permalloy on a bobbin. If the ends of the tape are not aligned on the same radial line, discontinuities in the toroid core are created because the magnetic path cross section is not constant.

The toroid can be constructed so that the tape start and stop positions are on approximately the same radial line. This reduces the discontinuity but does not completely eliminate it as the magnetic flux must travel across the minute air gaps between tape layers. The tape is ordinarily tightly wound to minimize this effect; however, discontinuities are still created because the permeability of the tape is several thousand times that of air.

These discontinuities generate a pulse in the secondary winding each time the core goes into or out of saturation because they unbalance the flux generated in the toroid (the core will saturate at the tape ends first). The effect of these pulses is to either increase or decrease the pulses generated in the secondary winding from the earth's magnetic field depending upon the polarity of the primary or excitation signal. The effect of these pulses can be balanced or calibrated out for a given temperature, but as they change in magnitude with temperature they may cause errors exceeding five degrees in heading when operated over a wide temperature range. The tape also expands and contracts with changes in temperature, causing the effect of the discontinuities to change with temperature.

Additionally, the change in pulse amplitude over a given temperature range varies for each particular magnetic core. These changes can cause errors up to plus or minus two degrees in heading accuracy over a temperature range from $-55°$ C. to $+70°$ C. The amount of change is dependent upon the type of magnetic material used and the tape thickness used to wind the core, but the value given above is considered typical for the best materials currently available. As a result, each core must be individually tested at a high and low temperature and calibrated accordingly. This is time consuming and necessarily increases the cost of the manufacturing process.

Figure 1A:
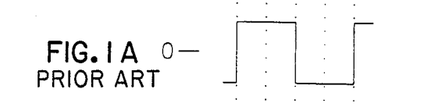
FIGS. 1A–1D show idealized waveforms applied to and generated by a fluxgate magnetometer of the prior art.
Figure 1B:
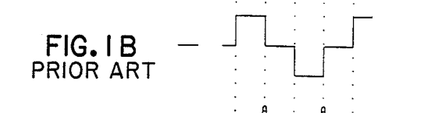
Figure 1C:
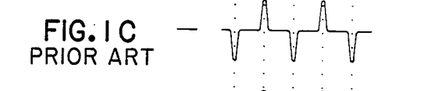
Figure 1D:
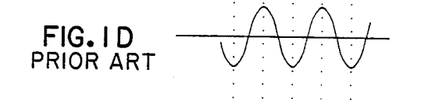

One method for adjusting a core in a fluxgate magnetometer at a given temperature is disclosed in Garner, *A Magnetic Heading Reference for the Electro-fluidic Autopilot*, Sport Aviation, Nov. 22, 1981 (Part 1). This method involves the alignment of the toroid core relative to the secondary winding so as to obtain a reasonably symmetrical sine wave output. In this method the primary winding of a fluxgate magnetometer is excited by a square wave of suitable frequency and amplitude (FIG. 1a) so that the core is saturated halfway through each cycle (FIG. 1b). As the core saturates and unsaturates, the pulses induced in the secondary winding will be at twice the frequency of the driving voltage (FIG. 1c). The secondary winding is then tuned to a frequency of twice the drive frequency to convert the series of pulses into a sine wave whose amplitude is proportional to the amplitude of the pulses and whose phase will reverse when that of the pulses does (FIG. 1d).

The secondary winding is tuned to the second harmonic of the drive frequency with an appropriate tuning capacitor. With the fluxgate positioned so that the centerline of the secondary winding is pointing in the north-south direction, the frequency of the oscillator is adjusted until a waveform of maximum amplitude is achieved. The core is then rotated within the cage coil until the best approximation of a sine curve can be observed.

The Garner method necessarily requires additional circuitry to center the saturation points halfway through each half cycle and to tune the secondary winding to the second harmonic of the drive frequency. Furthermore, whether or not the resonant frequency of the secondary winding and the tuning capacitor is within the frequency range covered by the oscillator will depend on the number of turns in the secondary winding, requiring different circuitry for different fluxgate constructions. Although this method adequately deals with the effects of tape end discontinuity at a given temperature, it does not satisfactorily compensate for the effects of discontinuity pulses over a wide temperature range or eliminate the effects of the change in the magnetic core properties that vary the secondary winding output amplitude in response to changes in temperature.

SUMMARY OF THE INVENTION

It is the intent of this invention to provide a fluxgate magnetometer which is capable of accurately detecting the intensity and direction of the earth's magnetic field over a wide operating temperature range without temperature compensating components.

It is a further intent of this invention to substantially eliminate the effects of changes in the magnetic core properties that vary with changes in temperature.

In accordance with the purpose of the invention, as embodied and broadly described herein, the present invention includes a fluxgate magnetometer comprising: a highly permeable magnetic core means of essentially constant magnetic path cross section; a primary winding means disposed on the core means for applying an alternating voltage to alternately saturate and unsaturate the core means with magnetic fields of opposite polarities; a secondary winding means disposed on the core means and primary winding means to form a fluxgate and being responsive to this alternate saturation and unsaturation of the core means inducing in the secondary winding means a voltage pulse upon each transition from core saturation to unsaturation, the secondary winding means being aligned relative to the core means such that, when the axis of the core means and the axis of said secondary winding means are oriented in an external magnetic field such as, for example, the earth's magnetic field, so that a portion of the external magnetic field passes through the secondary winding means, the voltage pulses induced in the secondary winding means by the transition from core saturation to unsaturation in one direction are substantially equal to the voltage pulses induced in the secondary winding means by the transition from core saturation to unsaturation in the opposite direction; input means for supplying an alternating voltage to the primary winding means; output circuit means for measuring and summing the voltage pulses induced in the secondary winding means; and means for determining the magnitude or direction of the external magnetic field from the measured and summed voltage pulses for given orientations of the fluxgate.

Preferably, the present invention further comprises a means for creating a saturation field strength of more than twenty times that required to drive the core means to what is commonly defined as maximum flux density or flux saturation.

Broadly, the present invention further includes a method for adjusting a fluxgate for temperature compensation, the fluxgate including a highly permeable magnetic core means of essentially constant magnetic path cross section, a primary winding means disposed on the core means, and a secondary winding means encompassing the core means and primary winding means, the method comprising the steps of: connecting the primary winding means to an alternating voltage source to alternately saturate and unsaturate the core means with magnetic fields of opposite polarities; maintaining the axis of the core means in an external magnetic field as, for example, the earth s magnetic field, so that a portion of the external magnetic field passes through the secondary winding means; detecting at the secondary winding means the voltage pulse induced in the secondary winding means upon each transition from core saturation to unsaturation; and aligning the core means relative to the secondary winding means to substantially equalize each of the detected pulses induced in the secondary winding means by the transition from core saturation to unsaturation in one direction with each of the detected pulses induced in the secondary winding means by the transition from core saturation to unsaturation in the opposite direction.

The voltage pulses induced by the transition of the core from unsaturation to saturation may be balanced and used in lieu of the voltage pulses induced by transition of the core from saturation to unsaturation, or both pulses may be used with the core rotated to obtain essentially equal unbalance between the four pulses.

The accompanying drawings, which are incorporated in and which constitute a part of this specification, illustrate an embodiment of the invention and, together with the description, explain the principles of the invention.

Additional advantages of the present invention will be set forth in part in the description that follows and in part will be obvious from that description or can be learned by practice of the invention. The advantages of the invention can be realized and obtained by the structure and method particularly pointed out in the appended claims.

DETAILED DESCRIPTION OF THE INVENTION

Reference now will be made in detail to presently preferred embodiments of the invention, examples of which are illustrated in the accompanying drawings.

Figure 2:
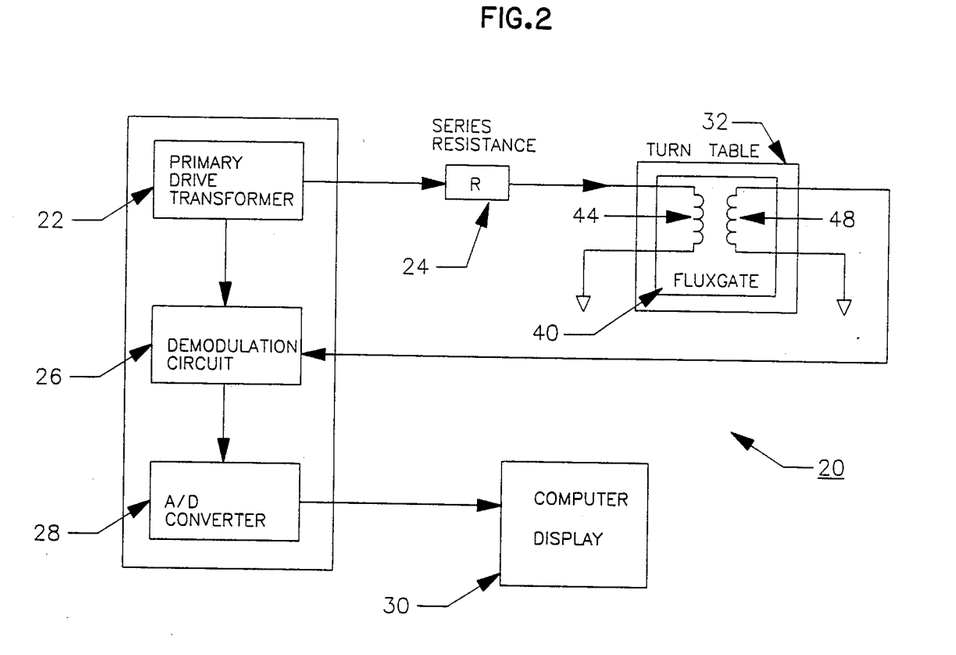
FIG. 2 is a schematic diagram of an embodiment of a fluxgate magnetometer according to the present invention.

Referring to FIG. 2, one embodiment of a fluxgate magnetometer according to the present invention is designated by the numeral 20. Fluxgate magnetometer 20 preferably includes a primary drive transformer 22 which supplies an alternating voltage to primary winding 44 of a calibrated fluxgate 40. Resistor 24 is in series with primary winding 44. Primary drive transformer 22 also drives demodulation circuit 26, which receives the output signals from secondary winding 48 of calibrated fluxgate 40.

Figure 3:
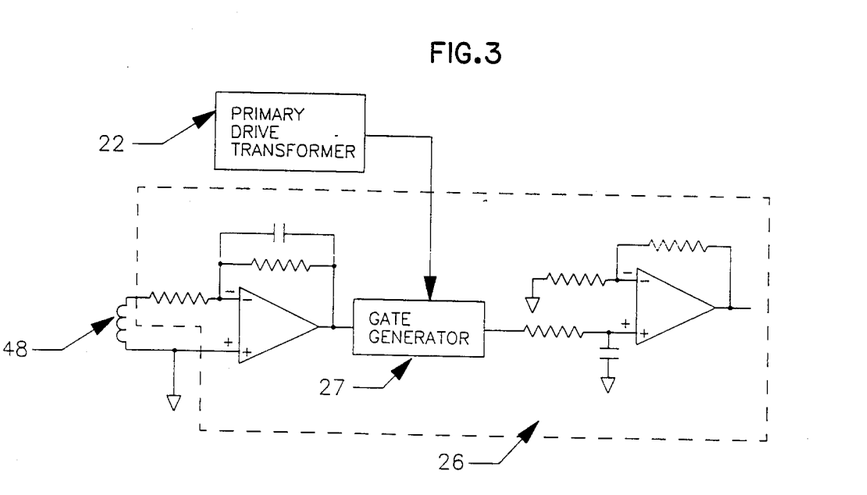
FIG. 3 is a schematic diagram of a demodulation circuit in accordance with one aspect of the present invention.

The function of demodulation circuit 26 is to gate the balanced pulses from the secondary winding 48 each time the primary drive voltage from the primary drive transformer 22 changes polarity. The demodulated pulses are then amplified and passed through a low-pass filter to produce a smooth DC signal. One example of a suitable demodulation circuit is shown in FIG. 3, which includes a gate generator 27 driven by the primary drive transformer 22. The output signals may also be tuned to provide an approximate sine wave and used to drive a syncro or any other suitable output detection device. Typically, this DC signal is then passed through an analog-to-digital converter 28, and the resultant digital signals are fed into a computer 30 where the information represented by the digital signals can be processed and analyzed.

Figure 4:
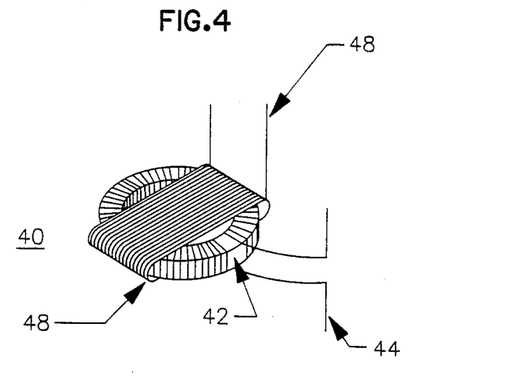
FIG. 4 is a diagram of an embodiment of a fluxgate according to the present invention.

The preferred embodiment of fluxgate 40, shown in FIG. 4, consists of magnetic core 42, a primary winding 44 and a secondary winding 48.

Figure 5:
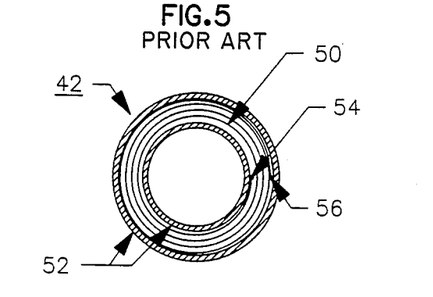
FIG. 5 is a sectional view of the interior of a typical magnetic tape core, taken normal to the axis of such a core.

The magnetic core 42 of fluxgate 40 is composed of a highly permeable mu material. For purposes of this invention, the magnetic core preferably has a mu value above 5,000. Referring to FIG. 5, one commercially available magnetic core suitable for use in this invention consists of ultrathin magnetic tape 50, such as Square Permalloy 80 manufactured by Magnetics, Inc., wound inside a stainless steel bobbin 52. The thickness of tape 50 can vary from less than 0.001 to several thousandths of an inch thick. The bobbin is typically enclosed in a ceramic casing to form a toroid such as toroid core 42 of FIG. 4.

Magnetic tape 50 has a tape start position 54 and a tape stop position 56. The magnetic path cross section of the core is variable due to the presence of air gaps between each layer of wound tape. In actuality, magnetic tape 50 will be more tightly wound than shown in FIG. 5, which is shown as loosely wound for drawing clarity, but minute air gaps will still remain. In some cores the tape start and stop positions 54 and 56 will not be on the same radial line, adding to the variation in magnetic path cross section.

Figure 6:
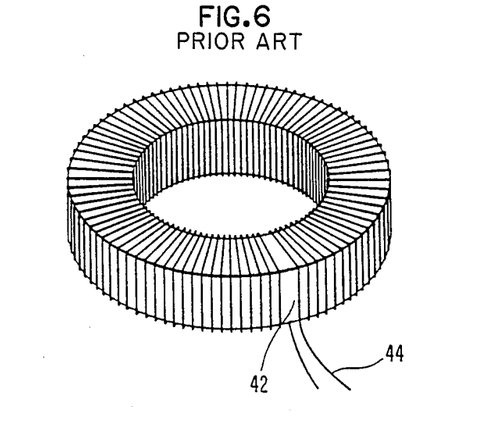
FIG. 6 is a diagram illustrating a typical primary winding wound on a conventional magnetic tape core.

Fluxgate 40 has a first primary winding 44 wound on core 42 as shown by example in FIG. 6. The function of primary winding 44 is to apply an alternating current to the core 42 to drive the core in and out of magnetic saturation with magnetic fields of opposite polarities.

Figure 7:
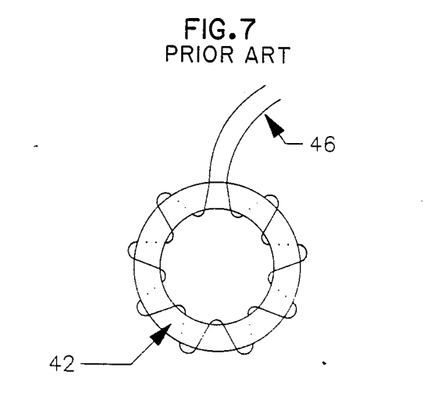
FIG. 7 is a diagram illustrating a typical secondary winding wound on a conventional magnetic tape core.

Fluxgate 40 also has a secondary winding on the magnetic core. The function of the secondary winding is to sense the voltage pulses induced in the secondary winding means by the alternating saturation and unsaturation of the magnetic core. As shown in FIG. 7, the secondary winding can be a wire coil 46 helically wound around a toroidal core 42 with the winding direction clockwise over one half of the core and counterclockwise over the other half of the core. The primary winding 44 is omitted from FIG. 7 in order to better illustrate the winding direction of coil 46. In the preferred embodiment of the present invention, the secondary winding is a pre-wound cage coil 48 which can be slipped over the core 42 and primary winding 44, as shown in FIG. 4.

The flux generated by the primary winding 44 travels around the toroid 42 so that its effect is cancelled out in the secondary winding because cage coil 48 encloses the complete toroid 42 (FIG. 4) or because the two halves of the secondary winding 14 are wound in opposite directions (FIG. 7). All of this is well understood in the art of designing fluxgates.

The present invention overcomes the problems of the prior art fluxgate magnetometers with regard to varying core discontinuity effects at different temperatures by eliminating the requirements that the magnetic core saturation occur halfway through each half cycle of the drive voltage waveform and that the secondary winding be tuned to the second harmonic of the drive frequency. The magnetic core is aligned relative to the secondary winding not on the basis of the optimal sine wave signal detected but on the basis of the best symmetry obtained between each of the primary or secondary output pulses observed at the secondary winding within one cycle of the drive voltage. This is not only a more accurate adjustment technique, but it is also one that employs simpler magnetometer circuitry, resulting in a smaller, less expensive device. The adjustment of fluxgate 40 for temperature compensation is discussed in greater detail with reference to FIG. 8.

Figure 8A:
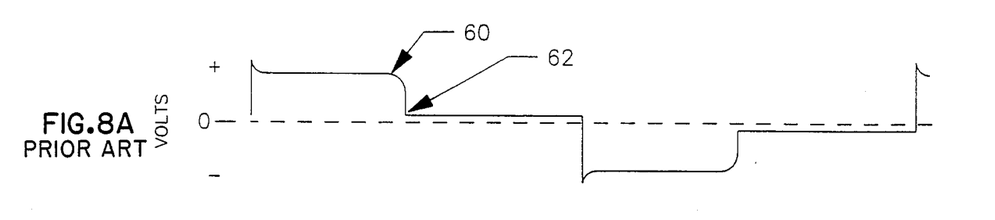
FIGS. 8A–8E show the waveforms applied to and the output pulse signals generated by a typical toroid fluxgate.
Figure 8B:
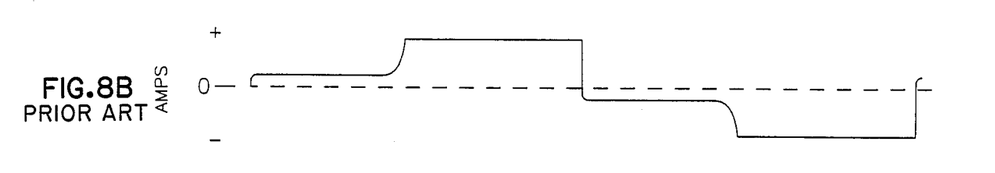
Figure 8C:
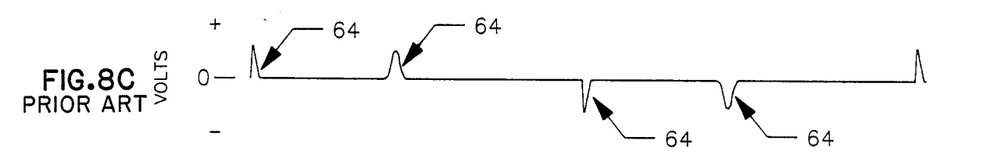

FIG. 8a shows a typical voltage wave form across the primary winding 44 of fluxgate 40 when it is excited by, for example, a square wave. The primary drive may be a square wave, a sine wave or any variation thereof. At point 60 magnetic core 42 starts to saturate and core 42 becomes fully saturated at point 62. FIG. 8b shows the corresponding current wave form in the primary winding 44 with the saturation current limited by resistor 24 in series with the primary winding 44. FIG. 8c shows typical discontinuity pulses 64 generated in, for example, secondary winding 48, assuming there is no external magnetic field (i.e., the earth's magnetic field) applied to the fluxgate. These discontinuity pulses are generated by the unbalanced flux resulting from the construction of the core and sensed by the secondary winding. The amplitudes of pulses 64 can be varied, for example, by rotating the magnetic core 42 within cage coil 48, or by the physical orientation of the secondary winding coil 46 with respect to the magnetic tape start and stop positions 54 and 56.

Figure 8D:
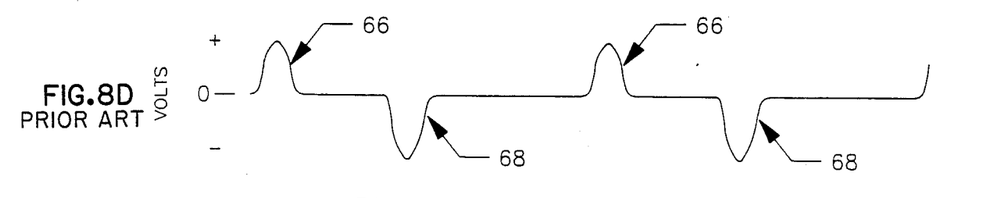

FIG. 8d shows typical pulses generated in, for example, secondary winding 48 by the inrush and outrush of an external magnetic field (i.e., the earth's magnetic field), assuming no discontinuities in the magnetic core. Pulses 66 are generated when the drive voltage across primary winding 44 is reversed in direction and magnetic core 42 goes out of saturation allowing the earth's magnetic field to rush in. Pulses 68 are generated when magnetic core 42 becomes saturated in the opposite polarity forcing most of the earth's field out of the core.

Figure 8E:
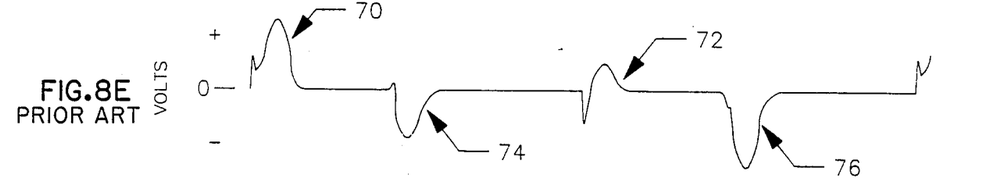

The discontinuity pulses 64 and the earth's magnetic field pulses 66 and 68 do not occur separately, but are shown separately in FIGS. 8c and 8d to better illustrate how they combine to provide the actual output waveform shown in FIG. 8e. The polarity of the pulses is dependent only on coil winding directions.

In order to generate the pulses of FIG. 8e, the primary winding 44 of fluxgate 40 must be connected to a suitable alternating voltage source. When balancing the output pulses of fluxgate 40, it is preferably that the axis of core 42 be maintained in a horizontal plane. This can be done, for example, by placing the axis of core 42 on a level surface such as a three axis table. The axis of the secondary winding (shown, for example, by the arrow in FIG. 4) is positioned parallel to the direction of the horizontal component of the earth's magnetic field, as determined by an external reference. However, the alignment of the secondary winding means may be made at any fixed orientation of the fluxgate in the external magnetic field, i.e., from an orientation that generates essentially zero secondary output voltge pulses to an orientation that maximizes secondary output voltage pulses. The output pulses in the secondary winding are then observed, for example, with a peak detector.

In the preferred embodiment of the present invention, the magnetic core 42 is rotated within secondary winding 48 until the combined discontinuity and earth's magnetic field output pulse pair 70 and 72 that occur when the magnetic core is driven out of saturation in both directions are substantially equal in amplitude. This adjustment can be determined, for example, by measuring the areas under pulses 70 and 72 or by superimposing one pulse over the other with the peak detector. The fluxgate then is rotated ninety degrees around the vertical axis until the output pulses are essentially zero. The core is then further rotated in the secondary coil, if necessary, until the two output pulses are at the minimum value that can be obtained. After the pulses of fluxgate 40 are balanced, secondary winding 48 is typically secured in alignment with respect to magnetic core 42 with an adhesive.

There are two results from aligning secondary winding 48 so the pulses 70 and 72 are substantially equal (within five percent maximum amplitude is satisfactory). First, the tape end discontinuity is rotated so that the discontinuity pulses 64 are reduced to a minimum value. Second, it can be noted from FIG. 8c that the discontinuity pulses 64 are opposite polarity for plus and minus magnetic saturation while in FIG. 8d both earth's magnetic field pulses 66 are of the same polarity. By making output pulses 70 and 72 equal, the effect of small changes in discontinuity pulses 64 is essentially eliminated because if discontinuity pulse 64 becomes larger, it adds to positive pulse 66, but subtracts equally from the next positive earth's magnetic field pulse 66. As both pulses are summed in the output the net result is no change in the combined value of the two pulses. Although the amplitudes of the discontinuity pulses will still change with changes in temperature, this alignment of the magnetic core with the secondary winding insures that the effects of changes in temperature are effectively minimized.

In the preferred embodiment only the positive output pulse pair 70 and 72 are detected and measured. This is because for some magnetic cores the positive output pulse pair 70 and 72 and the negative output pulse pair 74 and 76 cannot both be balanced (for plus and minus core saturation) with the same position of the core within the secondary winding. This can cause a slight decrease in accuracy over a wide temperature range. The terms positive and negative pulses are used herein only as a convenience in describing the invention. The pulse polarity can be reversed by reversing the secondary winding leads.

In addition, the occurence of the pulses 74 and 76 vary with respect to the switching of the primary winding drive voltage as the temperature is varied because of the change in magnetic properties of the core with temperature. This makes it more difficult to provide a gate at the appropriate time if a gate is used in the magnetometer signal detection circuitry.

Negative output pulse pair 74 and 76 can nonetheless be employed in the fluxgate 40. Often the secondary winding is used to drive a circuit that is resonant at the primary winding drive frequency. This will provide a sine wave output that can be directly demodulated or used for a directional gyro stabilization or syncro output. For these types of applications it is desireable to use both positive and negative output pulse pairs. Thus, in another embodiment of the present invention, magnetic core 42 is aligned with the secondary winding to obtain substantial symmetry between the positive output pulse pair 70 and 72 and between the negative output pulse pair 74 and 76. In this embodiment, core discontinuity position is determined, for example, by making all pulses as small and equal as possible.

Once the secondary winding 48 is secured in alignment with respect to magnetic core 42, the fluxgate 40 is then calibrated in accordance with conventional methods. As part of the fluxgate magnetometer 20 of FIG. 2, calibrated fluxgate 40 is preferably placed on a nonmagnetic turntable 32 to maintain the axis of core 42 in a horizontal plane. The fluxgate can be supported by a pendulum, gimbal, or any other device to provide a level environment under desired conditions.

Figure 9:
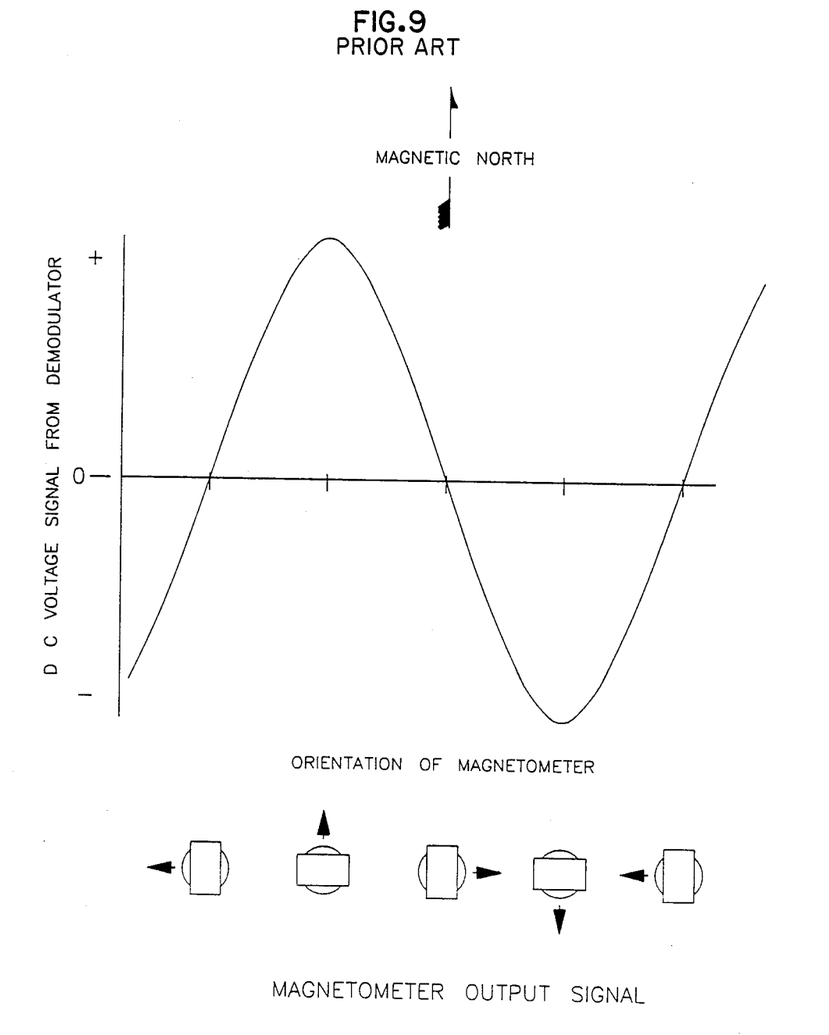
FIG. 9 is a drawing showing the outputs of the fluxgate magnetometer shown in FIG. 2 for different orientations of the fluxgate magnetometer.

A DC signal output such as that shown in FIG. 9 will be produced by fluxgate magnetometer 20 as calibrated fluxgate 40 is rotated 360° about the vertical axis of magnetic core 42. As can be seen, the demodulated DC voltage signal is of the highest positive value when the axis of the secondary winding in a horizontal plane is parallel to magnetic north. The slope of the curve becomes negative as the fluxgate is rotated in an easterly direction and positive as it is rotated in a westerly direction. This polarity will be reversed if the secondary coil leads are reversed. The amplitude of this signal is proportional to the strength of the earth s magnetic field. The magnetic field strength can then be calibrated by reference to known field strength amplitude values.

Figure 10:
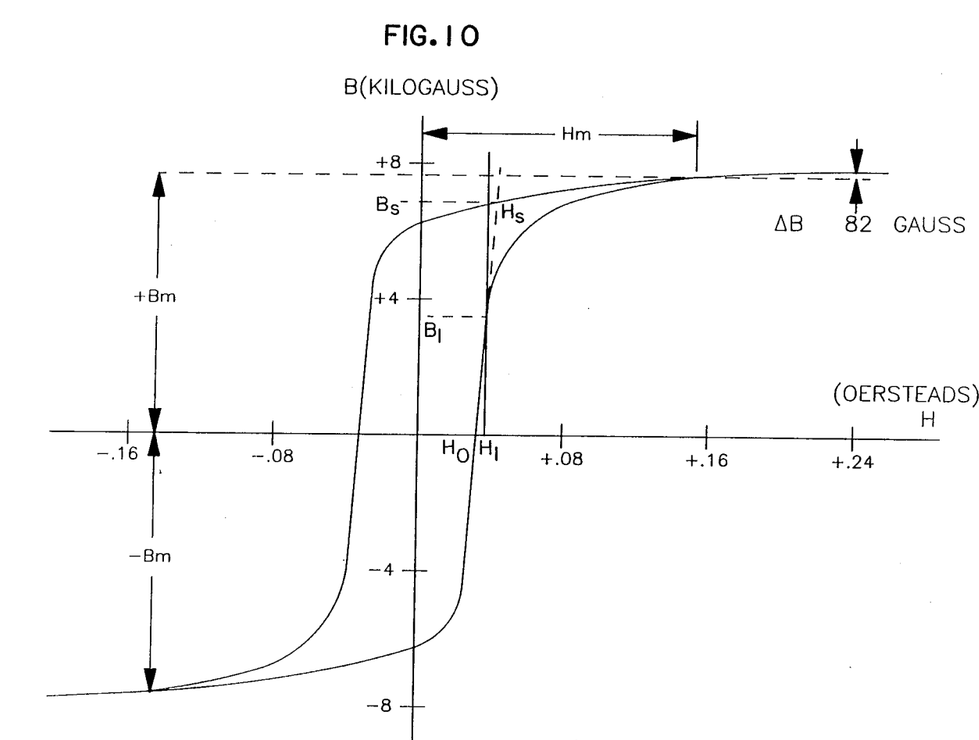
FIG. 10 is a graph showing a DC hysteresis curve for a magnetic tape core containing Square Permalloy 80 tape.

FIG. 10 shows a DC hysteresis curve for a magnetic tape core of a high permeability (mu) tape material (0.002" thick Square Permalloy 80 manufactured by Magnetics, Inc.). The magnetization force in oersteads necessary to obtain $B_m$ (commonly defined as maximum flux density or flux saturation) is 0.16 oersteads. At this point the magnetic core is normally considered saturated. However, it can be seen from FIG. 10 that an additional increase of 0.08 oersteads causes an increase in lines of flux (B) of approximately 82 gauss ($\Delta B$). This shows that the permeability of the core (82/0.08) is still much larger than air, which has a permeability of approximately one. Because the core has a greater permeability than air it still attracts some of the earth's magnetic field, which is referred to as "residual flux." As the permeability of the magnetic material varies slightly with temperature changes the amount of residual flux will also change with temperature.

Figure 11:
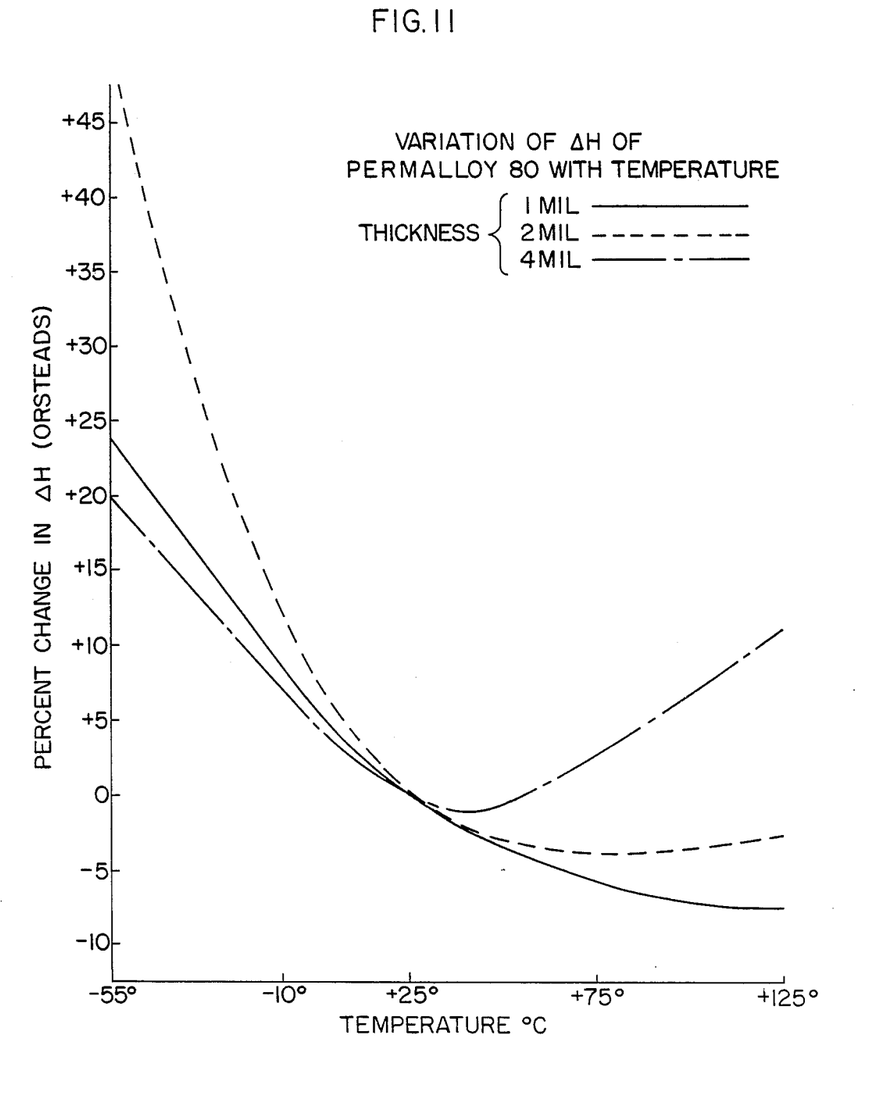
FIG. 11 is a graph showing typical variations in H with temperature changes for Square Permalloy 80 tape.

FIG. 11 shows typical variations in $\Delta H$ with temperature changes for permalloy 80 magnetic tape. $\Delta H$ is a measure of the squareness of the hysteresis loop of the magnetic core and is equal to $H_s-H_1$ (see FIG. 10). $B_s$ and $H_s$ are known points points used in the design of high mu magnetic material transformers and are designated as B saturated and H saturated. They are of interest in this discussion only because $H_s$ is one of the points that determines $\Delta H$. $B_1$ is one half of $B_s$ and this point determines $H_1$. $\Delta H$ increases at low temperatures and so the squareness of the hysteresis loop decreases and $\Delta B$ discussed above increases. This allows more residual flux to remain in the core when it is in what is normally considered the saturated state. The amplitude of the pulse generated by the earth's field when it rushes back into the magnetic core is proportional to the maximum earth's field flux in the core when the core is not saturated minus the residual flux. Because the residual flux varies with temperature changes the secondary winding pulse amplitude also changes with temperature changes.

In the preferred embodiment of this invention, fluxgate magnetometer 20 described above includes a drive transformer 22 capable of creating in magnetic core 42 of fluxgate 40 a saturation field strength (H) of greater than twenty times the field strength required to saturate magnetic core 42 ($H_s$). It has been experimentally determined that creating a saturation field strength of greater than $10H_s$ will substantially decrease the effects of temperature change on output pulse amplitude. This high saturation field strength also reduces variations in output levels between different core assemblies which simplifies calibration. It is preferred, however, that the saturation field strength be at least $20H_s$ to essentially eliminate the core temperature variation effects.

It was also determined that by increasing H to 40 times Hs the drive voltage can be varied over a plus or minus 15 percent range with negligible affect on the secondary winding output voltage amplitude. This eliminates the requirements to closely regulate the drive transformer. Field strengths of these magnitudes are easily attained when using a very high mu magnetic material such as Permalloy 80, as only 0.16 oersteads are required for Hs.

It was also found desirable to create high saturation field strengths not only when the fluxgate or fluxgate magnetometer of the present invention were in actual use, but also when the fluxgate core was first being aligned relative to the secondary winding means in an attempt to balance the output pulses in accordance with the methods described above.

It is also found desirable to create high saturation field strengths when the fluxgate core is first aligned relative to the secondary winding means in an attempt to balance the output pulses in accordance with the methods described above. Such saturation field strengths need not be as high as those created when the fluxgate or fluxgate magnetometer is in actual use. It is preferred, however, that the same high saturation field strength be used during alignment as in actual use for optimal results.

The final fluxgate assembly tested using this invention had a primary winding coil consisting of 240 turns and a mean magnetic core length of 2.7 inches. The necessary saturation current ($I_s$) that must be applied to the primary winding to create a saturation field strength of $40 \times 0.16H$ or $6.4H$ (oersteads) can be calculated according to the following equation:

$$I_s = \frac{H \times \text{Core mean length} \times \text{Conversion factor}}{\text{Number of primary winding turns}}$$

Thus, using 2.02 amp turns/inch as a measure of one oerstead, saturation current $I_s$ would be 0.145 amps for this fluxgate.

Magnetometers according to the present invention can consist of more than one fluxgate assembly. Magnetometers or fluxgate detectors often consist of two assemblies aligned 90 degrees apart or three assemblies aligned 120 degrees apart. This invention applies regardless of the number of coils or their alignment.

Two, three axis fluxgates were adjusted in accordance with the method of substantially equalizing output pulses 70 and 72. Each axis was used to represent longitudinal, lateral, and vertical axes, respectively. The magnetometer was then tested over a temperature range of $-55°$ C. to $70°$ C. The primary drive voltage was allowed to vary by plus or minus ten percent. Variation in magnetic headings (directions) calculated from the secondary winding output voltage of the fluxgate were accurate with 0.5 degrees for all conditions tested. Headings were tested every 15 degrees around the compass (360°). No temperature compensating components of any kind were required to obtain these results.

The magnetometer of FIG. 2 was calibrated on a compass rose using a nonmagnetic three axis table. The calibration was accomplished by taking magnetometer output readings simultaneously with Develco lab standard magnetometer output readings. Calibration constants for the magnetometer were then calculated by the using the Develco lab standard readings as a standard and solving simultaneous equations. These calibration constants were stored in computer memory. A comparison of the magnetometer outputs for several headings versus the Develco lab standard output for the same headings was accomplished after calibration. The average variation between the two magnetometers was 0.084° with a maximum of 0.18° at any one heading. It is believed that even better calibration can be obtained by using a three axis magnetometer table with an accurate inclinometer and calculating the earth's magnetic field components instead of using the Develco lab standard magnetometer.

A single three axis fluxgate magnetometer fabricated in accordance with this invention was tested at 23° C. and $-35°$ C. with saturation currents of $12.5H_s$ and $37.5H_s$. The results of these tests are summarized in the following Table:

| Is | Avg. Error (3 Units) | Avg. Peak Reading | % Error |
|---|---|---|---|
| 12.5 $H_s$ | 0.130 Volts | 2.55 Volts | 5.098% |
| 37.5 $H_s$ | 0.058 Volts | 2.55 Volts | 2.270% |

Thus, by increasing the saturation current from $12.5H_s$ to $37.5H_s$ an improvement of 2.73% accuracy was obtained. The remaining 2.27% error was primarily due to the output pulses not being 2.27% error was primarily due to the output pulses not being balanced on this unit.

Although this invention was designed to measure the magnitude and direction of the earth's magnetic field, the present invention can also be used to measure other magnetic fields by discounting the known intensity of the earth's magnetic field.

The invention in its broader aspects is, therefore, not limited to the specific details and illustrated examples shown and described. Accordingly, it is intended that the present invention cover such modifications and variations, provided that they fall within the scope of the appended claims and their equivalents.

What is claimed is:

1. A fluxgate magnetometer for maintaining accuracy over a wide temperature range comprising
   a high permeable magnetic core means of essentially constant magnetic path cross section;
   a primary winding means disposed on said core means for applying an alternating voltage to alternately saturate and unsaturate said core means with magnetic fields of opposite polarities;
   a secondary winding means disposed on said core means and said primary winding means to form a fluxgate and being responsive to said alternate saturation and unsaturation of said core means inducing in said secondary winding means a voltage pulse upon each transition from core saturation to unsaturation;
   means for creating a saturation field strength of more than 20 times that required to drive said core means to flux saturation;
   input means for supplying an alternating voltage to said primary winding means;
   output circuit means for measuring and summing the voltage pulses induced in said secondary winding means; and
   means for determining the magnitude or direction of said external magnetic field from said measured and summed voltage pulses for given orientations of said fluxgate.

2. A fluxgate magnetometer for maintaining accuracy over a wide temperature range comprising
   a highly permeable magnetic core means of variable magnetic path cross section;
   a primary winding means disposed on said core means for applying an alternating voltage to alternately saturate and unsaturate said core means with magnetic fields of opposite polarities;
   a secondary winding means disposed on said core means and said primary winding means to form a fluxgate and being responsive to said alternate saturation and unsaturation of said core means inducing in said secondary winding means a voltage pulse upon each transition from core saturation to unsaturation and a voltage pulse of opposite polarity upon each transition from core unsaturation to saturation;
   means for creating a saturation field strength of more than 20 times that required to drive said core means to flux saturation;
   input means for supplying an alternating voltage to said primary winding means;
   output circuit means for converting the voltage pulses induced in said secondary winding means to an output signal;
   means for determining the magnitude or direction of said magnetic field from said output signal for given orientations of said fluxgate.

3. A fluxgate magnetometer for maintaining accuracy over a wide temperature range comprising
   a highly permeable magnetic core means of essentially constant magnetic path cross section;
   a primary winding means disposed on said core means for applying an alternating voltage to alternately saturate and unsaturate said core means with magnetic fields of opposite polarities;
   a secondary winding means disposed on said core means and primary winding means to form a fluxgate and being responsive to said alternate saturation and unsaturation of said core means inducing in said secondary winding means a voltage pulse upon each transition from core unsaturation to saturation;
   means for creating a saturation field strength of more than 20 times that required to drive said core means to flux saturation;
   input means for supplying an alternating voltage to said primary winding means;
   output circuit means for measuring and summing the voltage pulses induced in said secondary winding means; and
   means for determining the magnitude or direction of said magnetic field from said measured and summed voltage pulses for given orientations of said fluxgate.

4. The fluxgate magnetometer of claim 1, 2, or 3 wherein said means for creating a saturation field strength is a means for creating a saturation field strength of at least forty times that required to drive said core means to flux saturation.

5. A method for adjusting a fluxgate to maintain accuracy over a wide temperature range, said fluxgate including a highly permeable magnetic core means of essentially constant magnetic path cross section, a primary winding means disposed on said core means, and a secondary winding means encompassing said core means and primary winding means, the method comprising the steps of:
   connecting said primary winding means to an alternating voltage source to alternately saturate and unsaturate said core means with magnetic fields of opposite polarities;
   maintaining the axis of said core means in an external magnetic field so that a portion of the external magnetic field passes through the secondary winding means;
   detecting at said secondary winding means the voltage pulse induced in said secondary winding means upon each transition from core saturation to unsaturation; and
   creating a saturation field strength of more than 20 times that required to drive said core means to flux saturation while aligning said core means relative to said secondary winding means to substantially equalize each of said detected pulses induced in said secondary winding means by the transition from core saturation to unsaturation in one direction with each of said detected pulses induced in said secondary winding means by the transition from core saturation to unsaturation in the opposite direction.

6. The method of claim 5, wherein said core means is aligned relative to said secondary winding means such that the amplitudes of said detected pulses induced in said secondary winding means by the transition from core saturation to unsaturation in one direction are within five percent of the amplitudes of said detected pulses induced in said secondary winding means by the transition from core saturation to unsaturation in the opposite direction.

7. A method for adjusting a fluxgate to maintain accuracy over a wide temperature range, said fluxgate including a highly permeable magnetic core means of essentially constant magnetic path cross section, a primary winding means disposed on said core means, and a secondary winding means encompassing said core means and primary winding means, the method comprising the steps of:

connecting said primary winding means to an alternating voltage source to alternately saturate and unsaturate said core means with magnetic fields of opposite polarities;

maintaining the axis of said core means in an external magnetic field so that a portion of the external magnetic field passes through the secondary winding means;

detecting at said secondary winding means the voltage pulse induced in said secondary winding means upon each transition from core unsaturation to saturation; and creating a saturation field strength of more than 20 times that required to drive said core means to flux saturation while aligning said core means relative to said secondary winding means to substantially equalize each of said detected second pulses induced in said secondary winding means by the transition from the core unsaturation to saturation in one direction with each of said detected pulses induced in said secondary winding means by the transition from core unsaturation to saturation in the opposite direction.

8. The method of claim 7, wherein said core means is aligned relative to said secondary winding means such that the amplitudes of said detected pulses induced in said secondary winding means by the transition from core unsaturation to saturation in one direction are within five percent of the amplitudes of said detected pulses induced in said secondary winding means by the transition from core unsaturation to saturation in the opposite direction.

9. A method for adjusting a fluxgate to maintain accuracy over a wide temperature range, said fluxgate including a highly permeable magnetic core means of essentially constant magnetic path cross section, a primary winding means disposed on said core means, and a secondary winding means encompassing said core means and primary winding means, the method comprising the steps of:

connecting said primary winding means to an alternating voltage source to alternately saturate and unsaturate said core means with magnetic fields of opposite polarities;

maintaining the axis of said core means in an external magnetic field so that a portion of the external magnetic field passes through the secondary winding means;

detecting at said secondary winding means the voltage pulse induced in said secondary winding means upon each transition from core saturation to unsaturation;

detecting at said secondary winding means the voltage pulse of opposite polarity induced in said secondary winding means upon each transition from core unsaturation to saturation; and creating a saturation field strength of more than 20 times that required to drive said core means to flux saturation while aligning said core means relative to said secondary winding means to obtain substantial symmetry between each of said detected pulses induced in said secondary winding means by the transition from core saturation to unsaturation in both directions and between each of said detected pulses induced in said secondary winding means by the transition from core unsaturation to saturation in both directions.

10. The method of claim 9, wherein said core means is aligned relative to said secondary winding means such that the positive output detected at said secondary winding means is substantially the same as the negative output.

11. A fluxgate for maintaining accuracy over a wide temperature range comprising a highly permeable magnetic core means of essentially constant magnetic path cross section;

a means for creating a saturation field strength of more than 20 times that required to drive said core means to flux saturation;

a primary winding means disposed on said core means for applying an alternating voltage to alternately saturate and unsaturate said core means with magnetic fields of opposite polarities; and a secondary winding means disposed on said core means and said primary winding means and being responsive to said alternate saturation and unsaturation of said core means inducing in said secondary winding means a voltage pulse upon each transition from core saturation to unsaturation.

12. A fluxgate for maintaining accuracy over a wide temperature range comprising a highly permeable magnetic core means of essentially constant magnetic path cross section;

a means for creating a saturation field strength of more than 20 times that required to drive said core means to flux saturation;

a primary winding means disposed on said core means for applying an alternating voltage to alternately saturate and unsaturate said core means with magnetic fields of opposite polarities; and a secondary winding means disposed on said core means and said primary winding means and being responsive to said alternate saturation and unsaturation of said core means inducing in said secondary winding means a voltage pulse upon each transition from core saturation to unsaturation and a voltage pulse of opposite polarity upon each transition from core unsaturation to saturation.

13. A fluxgate for maintaining accuracy over a wide temperature range comprising a highly permeable magnetic core means of essentially constant magnetic path cross section;

a means for creating a saturation field strength of more than 20 times that required to drive said core means to flux saturation;

a primary winding means disposed on said core means for applying an alternating voltage to alternately saturate and unsaturate said core means with magnetic fields of opposite polarities; and a secondary winding means disposed on said core means and said primary winding means and being responsive to said alternate saturation and unsaturation of said core means inducing in said secondary winding means a voltage pulse upon each transition from core unsaturation to saturation.

14. The fluxgate of claim 11, 12, or 13 wherein said means for creating a saturation field strength is a means for creating a saturation field strength of at least forty times that required to drive said core means to flux saturation.

15. The fluxgate of claim 5, 7, or 9 wherein said means for creating a saturation field strength is a means for creating a saturation field strength of at least forty times that required to drive said core means to flux saturation.

* * * * *

UNITED STATES PATENT AND TRADEMARK OFFICE
CERTIFICATE OF CORRECTION

PATENT NO. : 4,929,899
DATED : May 29, 1990
INVENTOR(S) : LAWRENCE M. WEIXELMAN and RICHARD D. SWANSON It is certified that error appears in the above-identified patent and that said Letters Patent is hereby corrected as shown below:

COVER PAGE

Please correct the Assignee to read:

--The Boeing Company
Seattle, Washington--

IN THE CLAIMS:

Column 11, line 8, change "high" to --highly--.

Signed and Sealed this

First Day of October, 1991

Attest:

HARRY F. MANBECK, JR.

Attesting Officer

Commissioner of Patents and Trademarks